United States Patent
Faiss

(10) Patent No.: US 11,351,629 B2
(45) Date of Patent: Jun. 7, 2022

(54) METHOD FOR FORMING A LASER-WELDED CONNECTION AND COMPOSITE COMPONENT

(71) Applicant: Robert Bosch GmbH, Stuttgart (DE)

(72) Inventor: Markus Faiss, Ofterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 809 days.

(21) Appl. No.: 16/316,200

(22) PCT Filed: Jun. 20, 2017

(86) PCT No.: PCT/EP2017/065057
§ 371 (c)(1),
(2) Date: Jan. 8, 2019

(87) PCT Pub. No.: WO2018/010919
PCT Pub. Date: Jan. 18, 2018

(65) Prior Publication Data
US 2020/0368847 A1 Nov. 26, 2020

(30) Foreign Application Priority Data
Jul. 12, 2016 (DE) ..................... 10 2016 212 690.3

(51) Int. Cl.
*B23K 26/24* (2014.01)
*B29C 65/16* (2006.01)
(Continued)

(52) U.S. Cl.
CPC ............ *B23K 26/009* (2013.01); *B23K 26/18* (2013.01); *B23K 26/24* (2013.01); *B29C 65/1635* (2013.01); *B23K 2101/32* (2018.08)

(58) Field of Classification Search
CPC .... B29C 65/1635; B23K 26/009; B23K 26/24
See application file for complete search history.

(56) References Cited

U.S. PATENT DOCUMENTS

| 4,636,609 A | * | 1/1987 | Nakamata | ........... B29C 37/0082 219/121.64 |
| 8,505,604 B2 | * | 8/2013 | Stauffer | .............. B29C 65/1683 156/379.6 |

(Continued)

FOREIGN PATENT DOCUMENTS

| DE | 10256254 | 6/2004 |
| DE | 102014211438 | 12/2015 |

(Continued)

OTHER PUBLICATIONS

International Search Report for Application No. PCT/EP2017/065057 dated Oct. 10, 2017 (English Translation, 3 pages).

*Primary Examiner* — Jimmy Chou
*Assistant Examiner* — Lawrence H Samuels
(74) *Attorney, Agent, or Firm* — Michael Best & Friedrich LLP

(57) ABSTRACT

The invention relates to a method for forming a laser-welded connection, in which two parts to be joined (11; 11*a*, 12; 12*a*) are connected to one another under the effect of a laser beam (1) in a joining region (30; 30*a*) to form a weld (2), wherein one part to be joined (11; 11*a*) consists of a material transparent to laser radiation and the other part to be joined (12; 12*a*) consists of a material absorbent to laser radiation, and wherein the two parts to be joined (11; 11*a*, 12; 12*a*) form a receptacle (25; 25*a*; 25*b*) for a component (13; 13*a*; 13*b*; 14) separate from the parts to be joined (11; 11*a*, 12; 12*a*).

12 Claims, 2 Drawing Sheets

(51) Int. Cl.
  *B23K 26/00* (2014.01)
  *B23K 26/18* (2006.01)
  *B23K 101/32* (2006.01)

(56) References Cited

U.S. PATENT DOCUMENTS

| | | | | |
|---|---|---|---|---|
| 10,016,562 | B2 * | 7/2018 | Holtwick | B29C 65/148 |
| 11,104,080 | B2 * | 8/2021 | Kihara | B32B 27/286 |
| 2002/0100540 | A1 * | 8/2002 | Savitski | B29C 66/5229 |
| | | | | 156/157 |
| 2004/0089640 | A1 * | 5/2004 | Bager | B29C 65/1645 |
| | | | | 219/121.64 |
| 2005/0081991 | A1 * | 4/2005 | Hatase | B29C 66/73921 |
| | | | | 156/272.8 |
| 2005/0094937 | A1 | 5/2005 | Sato et al. | |
| 2005/0191472 | A1 | 9/2005 | Oonishi | |
| 2005/0203225 | A1 * | 9/2005 | Nakagawa | B29C 66/14 |
| | | | | 524/190 |
| 2005/0251986 | A1 * | 11/2005 | Katayama | B29C 66/7352 |
| | | | | 29/458 |
| 2006/0278617 | A1 * | 12/2006 | Anantharaman | |
| | | | | B29C 66/53461 |
| | | | | 219/121.63 |
| 2007/0084551 | A1 * | 4/2007 | Watanabe | B29C 65/1658 |
| | | | | 156/272.8 |
| 2007/0084552 | A1 * | 4/2007 | Watanabe | B29C 66/3494 |
| | | | | 156/272.8 |
| 2007/0137779 | A1 * | 6/2007 | Mori | B29C 66/836 |
| | | | | 156/272.8 |
| 2009/0136717 | A1 * | 5/2009 | Kihara | B29C 66/12841 |
| | | | | 428/174 |
| 2010/0112746 | A1 * | 5/2010 | Suzuki | B29C 66/69 |
| | | | | 438/65 |
| 2011/0146903 | A1 * | 6/2011 | Stauffer | B29C 66/81431 |
| | | | | 156/272.8 |
| 2013/0022766 | A1 * | 1/2013 | Butzke | B29C 65/1616 |
| | | | | 428/35.7 |
| 2014/0364811 | A1 * | 12/2014 | Holtwick | B29C 65/565 |
| | | | | 604/187 |
| 2015/0239225 | A1 * | 8/2015 | Helmer | B29C 65/16 |
| | | | | 156/272.8 |
| 2018/0111327 | A1 * | 4/2018 | Watanabe | B29C 65/18 |
| 2019/0351623 | A1 * | 11/2019 | Kihara | B32B 27/18 |

FOREIGN PATENT DOCUMENTS

| | | |
|---|---|---|
| DE | 102014211443 | 12/2015 |
| EP | 2184784 | 5/2010 |
| JP | 2000233450 | 8/2000 |
| JP | 2001232687 | 8/2001 |
| JP | 2005238462 A | 9/2005 |
| JP | 2014220384 | 11/2014 |
| JP | 2015143026 A | 8/2015 |
| JP | 2015160334 | 9/2015 |
| WO | 2013072439 | 5/2013 |

* cited by examiner

METHOD FOR FORMING A LASER-WELDED CONNECTION AND COMPOSITE COMPONENT

BACKGROUND OF THE INVENTION

The invention relates to a method for forming a laser-welded connection. The invention also relates to a composite component.

A method for forming a laser-welded connection is known from DE 102 56 254 A1. The known method is used during the production of control devices in which a printed circuit board, as a component which is separate from two joining partners, is held by clamped engagement at the edges in a receptacle which is formed by the two joining partners. The receptacle is arranged in the region of an interior space, formed by the two joining partners, of the control device, wherein the two joining partners are welded to each other in the region of the outer side of the housing. To this end, a laser beam penetrates a material of the one joining partner which is transparent to the laser radiation right into the region of a joining region in which the laser beam is in functional communication with the material of the other joining partner which is absorbent to laser radiation. As a result of the absorption of the laser radiation, the material of the the last named joining partner is heated beyond its melting point and in the process also melts the material of the first named joining partner which is transparent to the laser radiation in order to form the welded connection.

The forming of a receptacle for the component which is separate from the joining partners, in the form of a through-hole, which enables the separate component, in a housing, to be guided through a housing wall in a sealed manner, as is required for example for cable lead-throughs, is not disclosed in the referenced document.

SUMMARY OF THE INVENTION

The method for forming a laser-welded connection according to the invention has the advantage that separate components, especially in the form of current-conducting cables or the like, can be arranged in a through-opening which is formed between the joining partners, wherein the region of the through-opening is closed off in a leakproof manner around the separate component after the forming of the welded connection in order to avoid, for example when the joining partners are used for forming a housing, entry of function-impairing media into the housing interior space.

The invention is based on the idea of on the one hand forming the separate component, at least in certain areas, from a material which is absorbent to laser radiation. Furthermore, the separate component is arranged in the region of the joining partner which is transparent to laser radiation in such a way that during the action of the laser radiation the material of the separate component which is absorbent to laser radiation is heated and as a result of heat transfer from the separate component the material of the joining partner which is transparent to laser radiation is melted and consequently the though-opening is closed off in a leakproof manner.

In a preferred embodiment of the so far described method according to the invention, it is provided that both the material of the joining partner which is transparent to laser radiation and the material of the separate component which is absorbent to laser radiation are melted and during melting form a materially bonded connection. As a result of the materially bonded connection or mixing of the materials of the at least one joining partner and of the separate component, a particularly good sealing of the through-opening is enabled.

The invention also covers a composite component which is formed according to a so far described method according to the invention, wherein the composite component is distinguished by the fact that the separate component is designed as a current-conducting component and has a sheath which is absorbent to laser radiation.

Advantageous developments of the composite component are explained in the dependent claims which are related to the composite component.

It is especially provided that a composite component forms a housing of a control device from the two joining partners, and that the separate component serves for the electrical contacting of an element which is arranged in the housing. In the case of the electrical element, it can for example be a circuit carrier or another electrical consumer. Such a composite component makes it possible to be able to dispense with a connector plug which is usually provided in a housing and which has to be connected to an external mating connector for the electrical contacting of a control device. Such a composite component therefore has the advantage that the production costs can be reduced, and that furthermore a particularly high degree of reliability of the electrical contacting is enabled since the customarily provided plug connection in the housing region does not have to be provided.

In the simplest case, the separate component is designed in the form of a power cable, wherein all electrical connections which are suitable for electrical contacting and/or power supply are to be understood by a power cable. The shape of such a power cable, moreover, does not need to be limited to power cables which are round in cross section with a single conductor or lead, rather provision can also be made for ribbon cables with a plurality of current-conducting conductors or leads.

Alternatively, it is also conceivable the separate component is designed as a plug connection element. In this case, welding or at least fixing of the plug connection element takes place in the region of the receptacle between the two joining partners, wherein the plug connection element is designed for the purpose of being connected to a corresponding mating connector. This solution has the advantage that for example separate sealing elements, such as rubber seals inter alia, can be dispensed with since a direct leakproof welding is carried out between the connecting plug or the cable (separate component) which is connected to the connecting plug and the joining partners or the housing.

To this end, it can be provided when using a plug connection element that the two joining partners form a free space in the region of the plug connection element which serves for being able to connect the mating connector to the plug connection element in a form-fitting manner. The receptacle is in this case designed in the region of the two joining partners in such a way that a free space remains in the region of the through-opening, which free space serves for the form-fitting arrangement of the mating connector.

It is essential when forming the composite component that during the action of the laser radiation a heat transfer is carried out from the material of the separate component which is absorbent to laser radiation to the material of the joining partner which is transparent to laser radiation. To this end, it is advantageous if the through-opening and/or the separate component of the through-opening have/has a cross section which in the installed state of the separate component in the through-opening forms an abutting contact between the through-opening and the separate component by means of which a good heat transfer from the separate component to the joining partner(s) is carried out.

Preferably, the design of the through-opening is in the form of a groove-like recess in that joining partner the material of which is transparent to the laser radiation. Such a groove-like recess has the advantage that the separate component can be joined and positioned in a particularly simple and accurate manner. A development of the so far described composite component provides that the joining partner which is absorbent to the laser radiation has an extension which projects into the groove-like recess. This extension, on the side facing the separate component, can especially have a shape which conforms to the separate component. As a result, the sealing on the side of the joining partner, which is transparent to the laser radiation, facing away from the separate component is optimized.

BRIEF DESCRIPTION OF THE DRAWINGS

Further advantages, features and details of the invention ensue from the following description of preferred exemplary embodiments and also with reference to the drawing.

In the drawing.

The same elements or elements with the same function are provided with the same designations in the figures.

DETAILED DESCRIPTION

Figure 1:
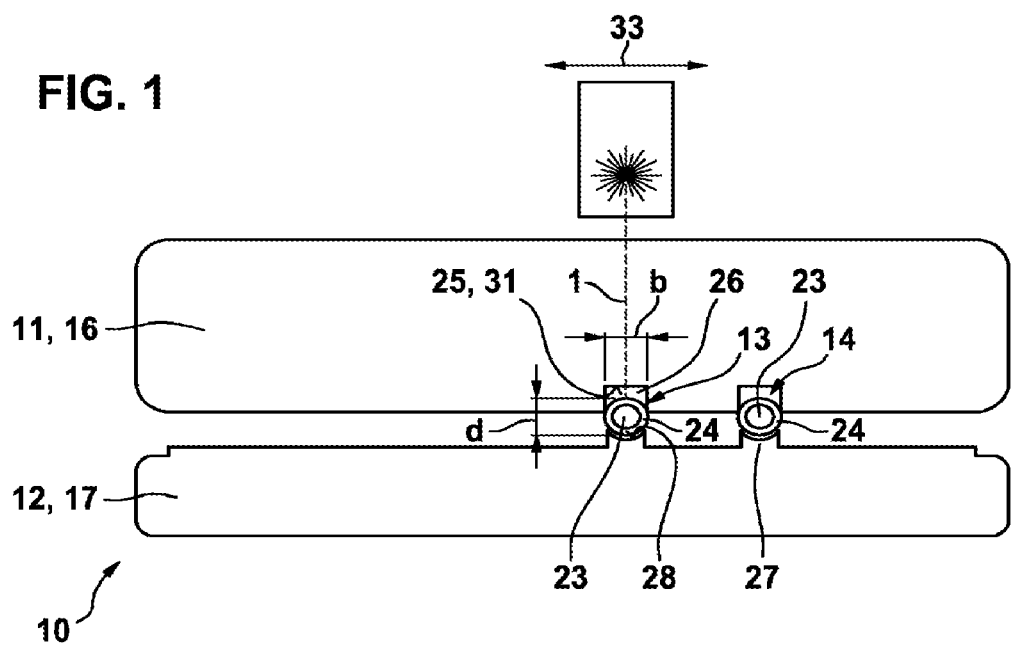
FIG. 1 shows a front view of the component parts of a composite component for forming a cable lead-through on a housing.
Figure 2:
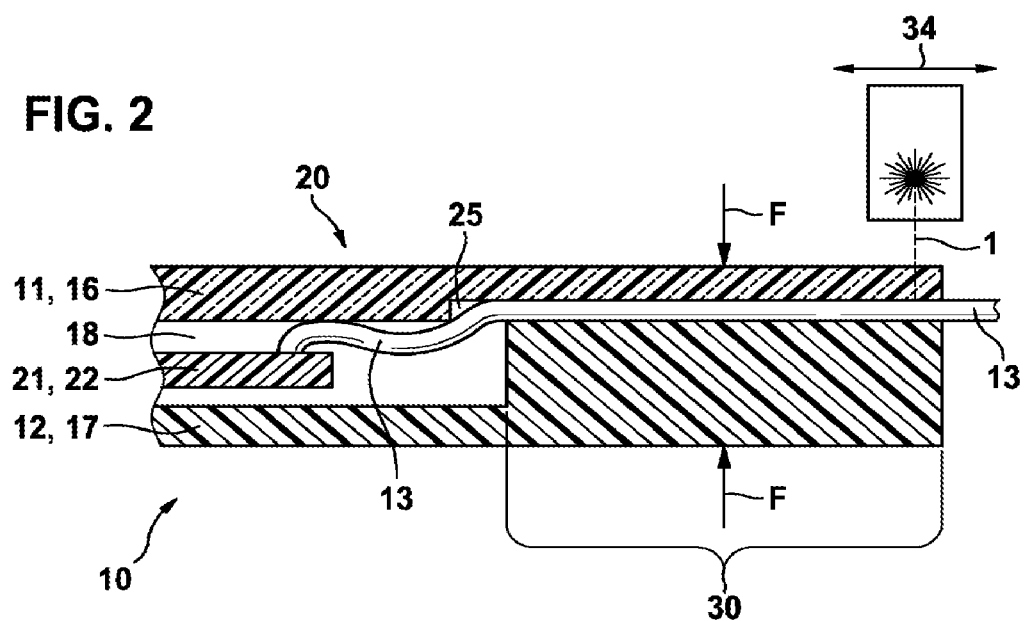
FIG. 2 shows the composite component according to FIG. 1 in a cross section during the forming of the connection between the joining partners.

Shown in FIGS. 1 and 2 is a composite component 10 which consists of a first joining partner 11, a second joining partner 12 and two cables 13, 14 which are separate from the two joining partners 11, 12 and serve for current conducting. By way of example, the first joining partner 11 is designed in the form of a housing cover 16 whereas the second joining partner 12 is a component part of a pot-like housing part 17 so that by the two joining partners 11, 12 or the housing cover 16 and the housing part 17 a housing 20, which forms an interior space 18, is formed after the (leakproof) connecting of the two joining partners 11, 12. Arranged in the interior space 18 of the housing 20 is an electrical consumer 21, for example in the form of a printed circuit board 22 or the like which has an electrical connection. The two cables 13, 14 serve for power supply or electrical contacting of the electrical consumer 21 in the housing 20 and therefore enable a contacting of the electrical consumer 21 from the outside into the interior space 18 of the housing 20.

The two cables 13, 14 which by way of example have the same diameters each have a round core in the form of an electrical conductor 23, for example in the form of a copper lead, which is enclosed by a sheath 24. By way of example, and not with a limiting effect, the sheath 24 consists of PP (polypropylene), PA (polyamide), ABS (acrylonitrile-butadiene-styrene-copolymer), and, to a limited extent, PBT (polybutylene terephthalate). It is essential that the material of the sheath 24 consists of a material which is absorbent to laser radiation, i.e. that under the effect of the laser radiation the material of the sheath 24 is heated of melted. Furthermore, the material of the first joining partner 11 (housing cover 16) consists of a material which is transparent to laser radiation, whereas the material of the second joining partner 12 (housing part 17), like the sheath 24 of the cables 13, 14, consists of a material which is absorbent to laser radiation. The two joining partners 11, 12 especially consist of plastic.

It is also essential when selecting the used materials of the two joining partners 11, 12 and also of the sheath 24 of the cables 13, 14 that the melted materials can preferably mix together, i.e. that after solidification they form a materially-bonded and therefore leakproof connection.

The first joining partner 11, on the side facing the second joining partner 12 in the region of a separating plane between the two joining partners 11, 12, has a recess 25, having a rectangular cross section, in the form of a groove which serves for the forming of a through-opening 26. Arranged inside the through-opening 26 is the respective cable 13, 14, wherein the cross section or diameter of the cable 13, 14 is adapted to the cross section of the recess 25 in such a way that the groove width b of the recess 25 is preferably the same size as, or slightly smaller than, the diameter d of the cable 13, 14 so that an abutment of the (at least slightly elastic or deformable) sheath 24 in the region of the recess 25 is enabled. Furthermore, in alignment with the recess 25 the second joining partner 12 has a rib-like raised portion 27 which, on the side facing the cable 13, 14, has a concave abutment surface 28 which is adapted to the shape of the cable 13, 14 or of the sheath 24.

During the installation of the two joining partners 11, 12 and the cables 13, 14, joining forces F, which can be recognized in FIG. 2, are applied to the joining partners 11, 12 so that the two joining partners 11, 12 are arranged in abutting contact with each other in a joining region 30. In this case, the two cables 13, 14 are accommodated in the region of the recess 25 and on one side butt against the bottom 31 of the recess 25 of the first joining partner 11 and on the other side, in the region of the abutment surface 28, butt against the raised portion 27 of the other joining partner 12.

For forming a connection between the two joining partners 11, 12 and also for sealing the through-opening 26 in the region of the cables 13, 14, a laser beam 1 is guided preferably along the outer contour of the two joining partners 11, 12. During this, the orientation of the laser beam 1 in relation to the joining partners 11, 12 is in such a way that the laser beam 1 enters the first joining partner 11 on the side of the first joining partner 11 facing away from the second joining partner 12. Due to the fact that the first joining partner 11 consists of a material which is transparent to laser radiation, the laser beam 1 makes its way right into the joining region 30 where it impinges upon the material of second joining partner 12 which is absorbent to laser radiation. In the joining region 30, the laser beam 1 effects heating and melting of the material of the second joining partner 12, wherein as a result of the abutting contact with the first joining partner 11 a heat transfer also occurs to the first joining partner 11 which consequently is also melted.

After the melting of the materials of the two joining partners 11, 12 and subsequent solidification of the materials, a laser-welded seam is formed between the two joining partners 11, 12. Corresponding to the view of FIG. 2, the laser beam 1 is also guided over the region of the two through-openings 26 with the cables 13, 14 located therein.

In the process, the material of the sheath 24 which is absorbent to laser radiation is also melted since the laser beam 1 enters the material of the sheath 24 in the region of the bottom of the recess 25. As a result of heat transfer of the heated material of the sheath 24, a melting of the material of the first joining partner 11 takes place on the side of the cable 13, 14 facing away from the raised portion 27. By the same token, the side region of the recess 25 is also melted by the material of the sheath 24 as a result of abutting contact, as well as the region of the abutment surface 28 in the region of the raised portion 27.

Although in principle it is sufficient if the laser beam 1 traverses the region of the recess 25 corresponding to the arrow 33 (FIG. 1) perpendicularly to its longitudinal extent so that melting of the material of the two joining partners 11, 12 and of the sheath 24 is carried out at a single point of the longitudinal extent of the recess 25, it is preferably provided that the laser beam 1, corresponding to the view of FIG. 2, is additionally moved along the extent of the recess 25 in the direction of the arrow 34 in order to enable melting of the sheath 24 over the entire length of the recess 25 and therefore to enable the forming of a leakproof connection.

Figure 3:
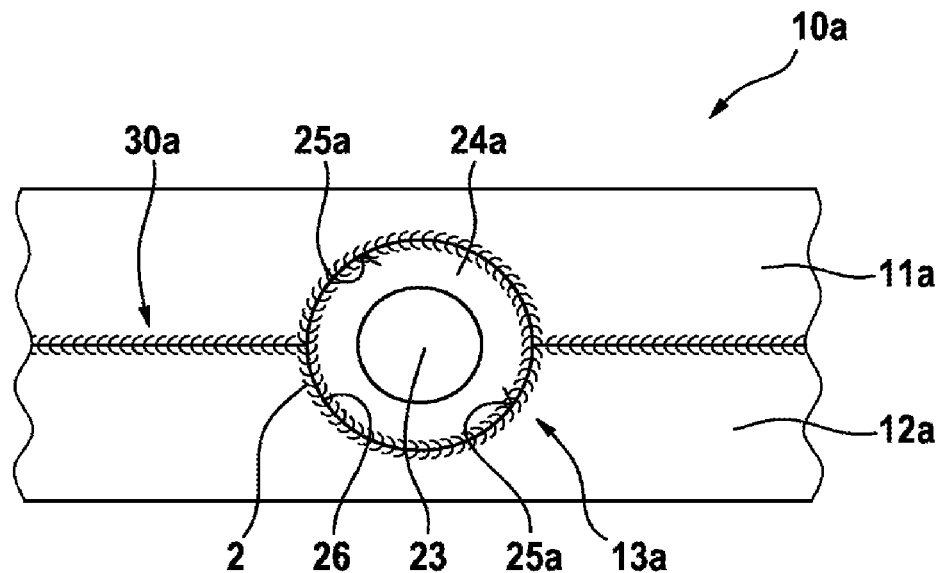
FIG. 3 shows a section in the region of the cable lead-through between two joining partners after the forming of the welded connection in a composite component which is modified compared with FIGS. 1 and 2.

Shown in FIG. 3 is a composite component 10a between two joining partners 11a, 12a which both have a recess 25a, which is semicircular in cross section, in the region of the through-opening 26. The cable 13a which is arranged in the middle and in abutting contact with the two recesses 25a has a weld seam 2 which encompasses the sheath 24a in a circular manner and continues on both sides of the recess 25a in the joining region 30a of the two joining partners 11a, 12a.

Figure 4:
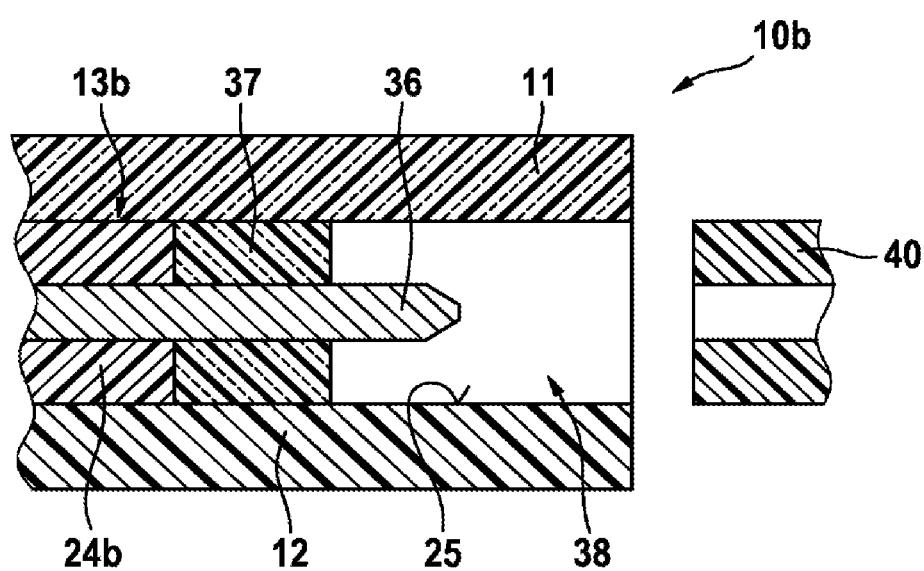
FIG. 4 shows a simplified view of a lead-through between two housing parts for forming a leakproof plug connection on a housing.

Shown in FIG. 4 is an exemplary embodiment with a composite component 10b in which in the region of the recess 25 on the side facing away from the interior space 18 a cable 13 forms a pin-like contact 36 in an adjoining body 37 which is formed as a separate component, wherein the adjoining body 37 consists of a material which is transparent to laser radiation, at least in the region of the contact 36. The sheath 24b of the cable 13b, which is absorbent to laser radiation, adjoins the adjoining body 37 in the direction of the interior space 18. Since the contact 36 is arranged in the region of the recess 25 and is positioned by means of the adjoining body 37 and also projects freely into the recess 25, the recess 25 forms a receptacle 38 for a mating connector 40, shown only in a simplified view, which serves for the electrical contacting of the cable 13a, and which can be inserted into the recess 25 or the through-opening 26 in a form-fitting manner in order to be connected in an electrically conducting manner to the contact 36.

The so-far described composite component 10, 10a, 10b and also the method for forming the connection between the joining partners 11, 11a, 12, 12a and the cables 13, 13a, 13b and 14 can be altered or modified in a variety of ways without deviating from the inventive idea. Furthermore, the invention is not intended to be limited to the use of current-conducting separate components which are arranged in the region of a through-opening 26 between the two joining partners 11, 11a, 12, 12a. Rather, it is also conceivable that any other components or elements in the region of a through-opening 26 can be guided through between two joining partners 11, 11a, 12, 12a. It is only essential that the material of an element which is located in the region of a through-opening 26 and separate from the two joining partners 11, 11a, 12, 12a is designed to be absorbent to laser radiation and is arranged in functional communication or abutting contact with the one of the two joining partners 11, 11a, 12, 12a which is transparent to laser radiation.

What is claimed is:

1. A method for forming a laser-welded connection, in which a first joining partner (11;11a) and a second joining partner (12; 12a) are connected to each other by action of a laser beam (1) in a joining region (30, 30a), forming a weld seam (2), wherein the first joining partner (11; 11a) is made of a material which is transparent to laser radiation and the second joining partner (12; 12a) is made of a material which is absorbent to laser radiation, and wherein a receptacle (25; 25a; 25b) for a component (13; 13a; 13b; 14) which is separate from the joining partners (11; 11a; 12; 12a) is formed by the joining partners (11; 11a; 12; 12a), wherein the receptacle (25; 25a; 25b) is designed as a through-opening (26), wherein the separate component (13; 13a; 13b; 14) includes a sheath (24; 24a; 24b), which is absorbent to laser radiation, wherein the material of the sheath (24; 24a; 24b) is arranged in a functionally communicating manner with the first joining partner (11; 11a), and wherein the laser beam (1) acts upon the sheath (24; 24a; 24b) so that by means of heat transfer from the sheath (24; 24a; 24b) the material of the first joining partner (11; 11a) is melted and closes off the through-opening (26).

2. The method as claimed in claim 1, characterized in that the sheath (24; 24a; 24b), which is absorbent to laser radiation, is melted and together with the material of the first joining partner (11; 11a) forms a materially-bonded connection.

3. The method as claimed in claim 1,
characterized in that
the laser beam (1) is moved across and along the extent of the through-opening (26).

4. A method for producing a composite component (10; 10a; 10b), the method comprising
performing the method as claimed in claim 1,
wherein the separate component (13; 13a; 13b) includes a current-conducting component within the sheath (24; 24a; 24b).

5. The method as claimed in claim 4,
wherein the joining partners (11; 11a; 12; 12a) are component part of a housing (20), and
wherein the separate component (13; 13a; 13b; 14) serves for electrical contacting of an element (21) which is arranged in the housing (20).

6. The method as claimed in claim 4,
characterized in that
the separate component (13; 13a; 13b; 14) is a power cable.

7. The method as claimed in claim 4,
characterized in that
the separate component (13b) inside the receptacle (25) is connected to an adjoining body (37) which is transparent to laser radiation.

8. The method as claimed in claim 7,
characterized in that
the through-opening (26), in a region of the adjoining body (37) on a side facing away from the separate component (13b), forms a free space from material of the first joining partner (11, 12) for accommodating a mating connector (40).

9. The method as claimed in claim 4,
characterized in that
the through-opening (26) and/or the separate component (13; 13a; 13b; 14) in a region of the through-opening (26) have/has a cross section which in the installed state of the separate component (13; 13a; 13b; 14) in the through-opening (26) before the action of the laser beam (1) forms an abutting contact between the through-opening (26) and the separate component (13; 13*a*; 13*b*; 14).

10. The method as claimed in claim 4, characterized in that
the through-opening (26) is a groove-like recess which is formed in at least the first joining partner (11).

11. The method as claimed in claim 10, characterized in that
the second joining partner (12) has a raised portion (27) which projects into the groove-like recess and butts against the separate component (13, 14).

12. The method as claimed in claim 4, characterized in that
the through-opening (26) is arranged in the joining region (30; 30*a*) between the joining partners (11; 11*a*; 12; 12*a*).

* * * * *